(12) United States Patent  (10) Patent No.: US 10,390,305 B1
Geekie et al.  (45) Date of Patent: Aug. 20, 2019

(54) TIMING CALIBRATION CONTROL IN EXTENDED DISCONTINUOUS RECEPTION

(71) Applicant: QUALCOMM Incorporated, San Diego, CA (US)

(72) Inventors: James Francis Geekie, Carlsbad, CA (US); Suyash Ranjan, San Diego, CA (US); Xu Chi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/981,737

(22) Filed: May 16, 2018

(51) Int. Cl.
*H04L 12/28* (2006.01)
*H04W 52/02* (2009.01)
*H04W 56/00* (2009.01)
*H04L 29/08* (2006.01)

(52) U.S. Cl.
CPC ... *H04W 52/0216* (2013.01); *H04W 52/0229* (2013.01); *H04W 56/0035* (2013.01); *H04L 67/12* (2013.01)

(58) Field of Classification Search
CPC .................................................... H04L 12/28
USPC .................................................... 370/329
See application file for complete search history.

(56) References Cited

U.S. PATENT DOCUMENTS 5,956,376 A * 9/1999 Nakaya .................. H04B 1/28
375/340

\* cited by examiner

*Primary Examiner* — Dang T Ton

(57) ABSTRACT

Methods, systems, and devices for wireless communication in a user equipment (UE) are described in which a cycle duration of an extended discontinuous reception (eDRX) cycle is determined. The UE enters a sleep state of the eDRX cycle and, based on the determination of the cycle duration, uses a first clock as a timer during the sleep state and uses a second clock as a timing calibrator during the sleep state. The first clock may have a lower power consumption and a higher frequency error, and the second clock may have a higher power consumption and a lower frequency error.

30 Claims, 9 Drawing Sheets

TIMING CALIBRATION CONTROL IN EXTENDED DISCONTINUOUS RECEPTION

BACKGROUND

Field of the Disclosure

The following relates generally to wireless communication, and more specifically to timing calibration control in extended discontinuous reception (eDRX).

Description of Related Art

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as a Long Term Evolution (LTE) systems or LTE-Advanced (LTE-A) systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform-spread-OFDM (DFT-S-OFDM). A wireless multiple-access communications system may include a number of base stations or network access nodes, each simultaneously supporting communication for multiple communication devices, which may be otherwise known as user equipment (UE).

Wireless communication systems may support communication for Internet-of-Things (IoT) devices that may be characterized as low cost or low complexity devices. Some IoT devices may be battery-powered, and interest has been shown in extending the battery life of IoT devices. In some scenarios, IoT devices may have relatively long durations of idleness between durations of communication. Some IoT devices may support extended discontinuous reception (eDRX) operations that allow the IoT device to enter relatively long sleep cycles between durations of communication. During sleep cycles, however, IoT devices may still perform some operations, such as clock operations, that require battery power.

SUMMARY

The described techniques relate to methods, systems, devices, or apparatuses that support timing calibration control in extended discontinuous reception (eDRX).

A method of wireless communication is described. The method may include determining a cycle duration of an eDRX cycle, entering a sleep state of the eDRX cycle and, determining whether to use a first clock as a timer a second clock as a timing calibrator during the sleep state based on the cycle duration of the eDRX cycle. The first clock may have a lower power consumption and a higher frequency error, and the second clock may have a higher power consumption and a lower frequency error.

An apparatus for wireless communication is described. The apparatus may include means for determining a cycle duration of an eDRX cycle, means for entering a sleep state of the eDRX cycle and means determining whether to use a first clock as a timer a second clock as a timing calibrator during the sleep state based on the cycle duration of the eDRX cycle. The first clock may have a lower power consumption and a higher frequency error, and the second clock may have a higher power consumption and a lower frequency error.

Another apparatus for wireless communication is described. The apparatus may include a clock manager including a first clock and a second clock having a higher power consumption and a lower frequency error than the first clock, a processor, memory coupled to the processor, and instructions stored in the memory and operable, when executed by the processor, to cause the UE to determine a cycle duration of an eDRX cycle of the UE and determine whether to use the first clock as a timer and the second clock as a timing calibrator for the first clock during a sleep state of the eDRX cycle based on the cycle duration of the eDRX cycle.

A non-transitory computer readable medium storing code for wireless communication is described. The code may include instructions executable by a processor to determine a cycle duration of an eDRX cycle, enter a sleep state of the eDRX cycle and, determine whether to use a first clock as a timer and a second clock as a timing calibrator during the sleep state based on the cycle duration of the eDRX cycle. The first clock may have a lower power consumption and a higher frequency error, and the second clock may have a higher power consumption and a lower frequency error.

DETAILED DESCRIPTION

Aspects of the disclosure describe timing calibration control in extended discontinuous reception (eDRX) operation of a user equipment (UE). In one aspect, multiple clocks are used for timing and timing calibration during a sleep state of an eDRX cycle. A first clock may be used as a timer, and a second clock may be used as a calibrator of the first clock. The first clock may have a lower power consumption and higher frequency error, and the second clock may have a higher power consumption and a lower frequency error. A determination as to whether to use the first clock as the timer and the second clock as the calibrator (also referred to as "calibration mode" or "clock calibration mode" herein) may be based on one or more factors. In one example, the one or more factors may include the length of the eDRX cycle (and/or the length of the sleep state of the eDRX cycle). The one or more factors may also include the calibration frequency (e.g., how often the second clock is turned on to calibrate the first clock) and various energy consumptions such as an energy consumption of using the calibration mode and an energy consumption of using a modified search algorithm. Although not required, one or more advantages may be provided by one or more aspects of the disclosure, and these advantages may include, but are not limited to improved energy consumption and battery-power savings.

Aspects of the disclosure are initially described in the context of a wireless communications system. Aspects of the disclosure are further illustrated by and described with reference to apparatus diagrams, system diagrams, and flowcharts that relate to timing calibration control in eDRX.

Figure 1:
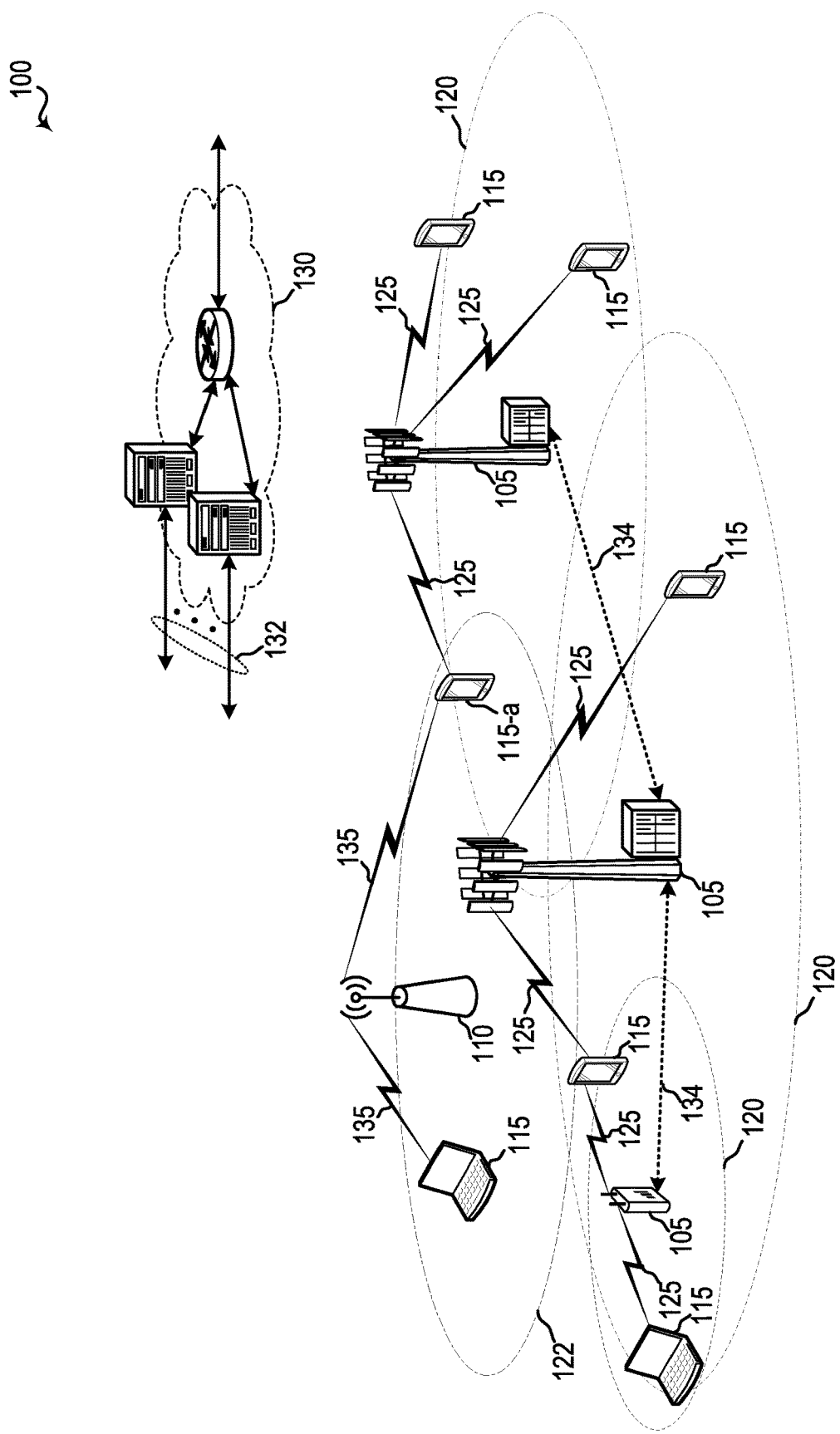
FIG. 1 illustrates an example of a system for wireless communication that supports timing calibration control in extended discontinuous reception (eDRX) in accordance with aspects of the present disclosure.

FIG. 1 illustrates an example of a wireless communications system 100 that supports timing calibration control in eDRX in accordance with various aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation Node B or giga-nodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions, from a base station 105 to a UE 115. Downlink transmissions may also be called forward link transmissions while uplink transmissions may also be called reverse link transmissions.

The geographic coverage area 110 for a base station 105 may be divided into sectors making up only a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1 or other interface). Base stations 105 may communicate with one another over backhaul links 134 (e.g., via an X2 or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 MHz to 300 GHz. Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that can tolerate interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115 (e.g., for multiple-input multiple-output (MIMO) operations such as spatial multiplexing, or for directional beamforming). However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ LTE License Assisted Access (LTE-LAA) or LTE-Unlicensed (LTE-U) radio access technology or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a CA configuration in conjunction with CCs operating in a licensed band. Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some cases, the antennas of a base station 105 or UE 115 may be located within one or more antennas or antenna arrays, which may support MIMO operations such as spatial multiplexing, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

MIMO wireless systems use a transmission scheme between a transmitting device (e.g., a base station 105) and a receiving device (e.g., a UE 115), where both transmitting device and the receiving device are equipped with multiple antennas. MIMO communications may employ multipath signal propagation to increase the utilization of a radio frequency spectrum band by transmitting or receiving different signals via different spatial paths, which may be referred to as spatial multiplexing. The different signals may, for example, be transmitted by the transmitting device via different antennas or different combinations of antennas. Likewise, the different signals may be received by the receiving device via different antennas or different combinations of antennas. Each of the different signals may be referred to as a separate spatial stream, and the different antennas or different combinations of antennas at a given device (e.g., the orthogonal resource of the device associated with the spatial dimension) may be referred to as spatial layers.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a direction between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain phase offset, timing advance/delay, or amplitude adjustment to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may multiple use antennas or antenna arrays to conduct beamforming operations for directional communications with a UE 115. For instance, signals may be transmitted multiple times in different directions, which may include a signal being transmitted according to different beamforming weight sets associated with different directions of transmission. A receiving device (e.g., a UE 115, which may be an example of a mmW receiving device) may try multiple receive beams when receiving various signals from the base station 105, such as synchronization signals or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical (PHY) layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds ($T_f=307200*T_s$). The radio frames may be identified by a system frame number (SFN) ranging from 0 to 1023. Each frame may include ten subframes numbered from 0 to 9, and each subframe may have a duration of 1 millisecond. A subframe may be further divided into two slots each having a duration of 0.5 milliseconds, and each slot may contain 6 or 7 modulation symbol periods (e.g., depending on the length of the cyclic prefix prepended to each symbol period). Excluding the cyclic prefix, each symbol period may contain 2048 sampling periods. In some cases a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols and in some instances, a symbol of a mini-slot or a mini-slot may be the smallest unit of scheduling. Each symbol may vary in duration depending on the subcarrier spacing or frequency band of operation, for example. Some wireless communications systems may implement slot aggregation in which multiple slots or mini-slots may be aggregated together for communication between a UE 115 and a base station 105.

A resource element may consist of one symbol period (e.g., a duration of one modulation symbol) and one subcarrier (e.g., a 15 kHz frequency range). A resource block may contain 12 consecutive subcarriers in the frequency domain (e.g., collectively forming a "carrier") and, for a normal cyclic prefix in each orthogonal frequency-division multiplexing (OFDM) symbol, 7 consecutive OFDM symbol periods in the time domain (1 slot), or 84 total resource elements across the frequency and time domains. The number of bits carried by each resource element may depend on the modulation scheme (the configuration of modulation symbols that may be applied during each symbol period). Thus, the more resource elements that a UE 115 receives and the higher the modulation scheme (e.g., the higher the number of bits that may be represented by a modulation symbol according to a given modulation scheme), the higher the data rate may be for the UE 115. In MIMO systems, a wireless communications resource may refer to a combination of a radio frequency spectrum band resource, a time resource, and a spatial resource (e.g., spatial layers), and the use of multiple spatial layers may further increase the data rate for communications with a UE 115.

The term "carrier" refers to a set of radio frequency spectrum resources having a defined organizational structure for supporting uplink or downlink communications over a communication link 125. For example, a carrier of a communication link 125 may include a portion of a radio frequency spectrum band that may also be referred to as a frequency channel. In some examples a carrier may be made up of multiple sub-carriers (e.g., waveform signals of multiple different frequencies). A carrier may be organized to include multiple physical channels, where each physical channel may carry user data, control information, or other signaling.

The organizational structure of the carriers may be different for different radio access technologies (e.g., LTE, LTE-A, NR, etc.). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, or 20 MHz). In some examples the system bandwidth may refer to a minimum bandwidth unit for scheduling communications between a base station 105 and a UE 115. In other examples a base station 105 or a UE 115 may also support communications over carriers having a smaller bandwidth than the system bandwidth. In such examples, the system bandwidth may be referred to as "wideband" bandwidth and the smaller bandwidth may be referred to as a "narrowband" bandwidth. In some examples of the wireless communications system 100, wideband communications may be performed according to a 20 MHz carrier bandwidth and narrowband communications may be performed according to a 1.4 MHz carrier bandwidth.

Devices of the wireless communications system 100 (e.g., base stations or UEs 115) may have a hardware configuration that supports communications over a particular carrier bandwidth, or may be configurable to support communications over one of a set of carrier bandwidths. For example, base stations 105 or UEs 115 may perform some communications according to a system bandwidth (e.g., wideband communications), and may perform some communications according to a smaller bandwidth (e.g., narrowband communications). In some examples, the wireless communications system 100 may include base stations 105 and/or UEs that can support simultaneous communications via carriers associated with more than one different bandwidth.

Wireless communications system 100 may support communication with a UE 115 on multiple cells or carriers, a feature which may be referred to as carrier aggregation (CA) or multi-carrier operation. A UE 115 may be configured with multiple downlink CCs and one or more uplink CCs according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other CCs, which may include use of a reduced symbol duration as compared with symbol durations of the other CCs. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications systems such as an NR system may use a combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

Devices of the wireless communications system 100 may be capable of operating in a discontinuous reception (DRX) and/or an enhanced DRX (eDRX) mode. In some aspects, UE 115 may be configured with multiple clocks that may be selectively used during a sleep state to reduce power and energy consumption as described in more detail below. In one example, UE 115 may be an IoT device capable of operating in eDRX mode.

Figure 2:
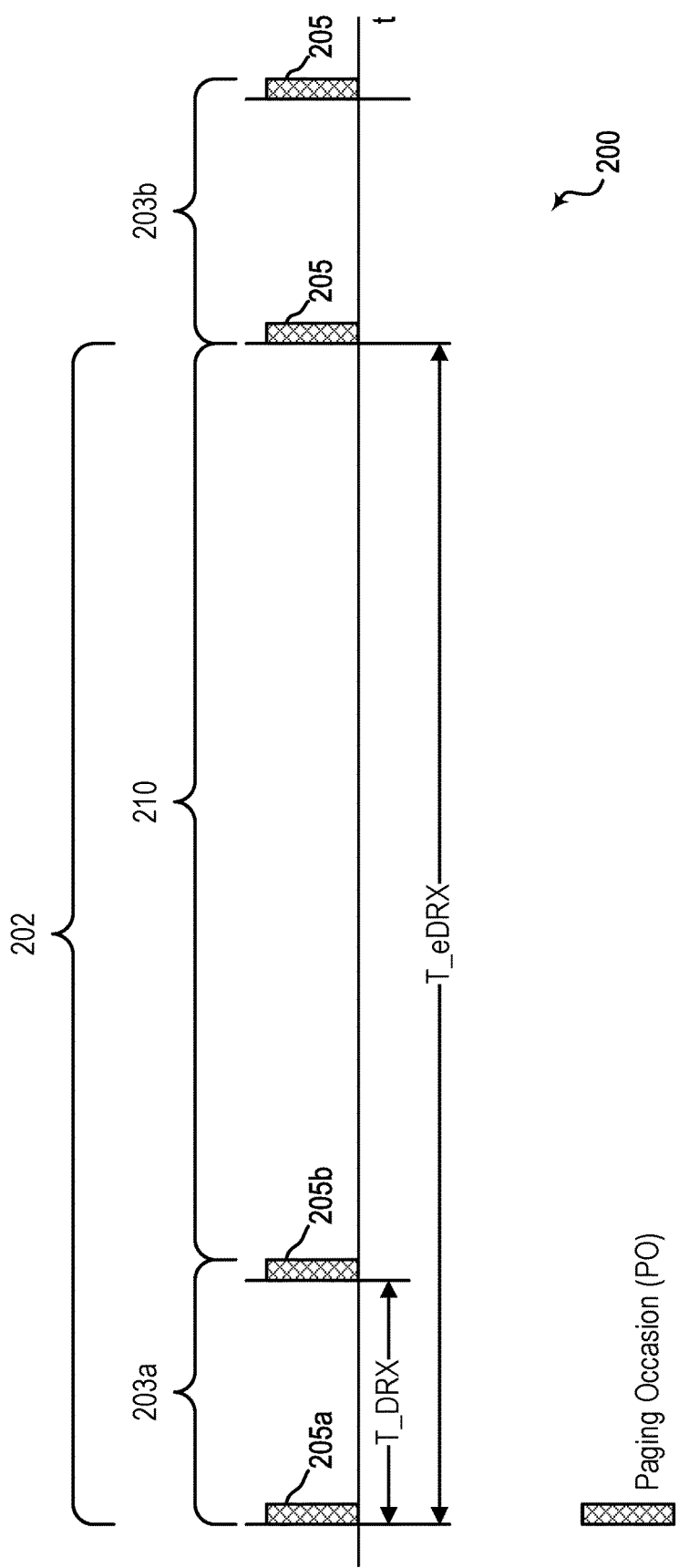
FIG. 2 illustrates a timeline diagram of DRX and eDRX cycles in accordance with aspects of the present disclosure.

FIG. 2 illustrates a timeline diagram 200 demonstrating operational states of UE 115 during an idle mode eDRX cycle 202 accordance with various aspects of the present disclosure. The eDRX cycle 202 may be configured with a paging time window 203a in which UE 115 may monitor for signals (e.g., paging messages) from the network (e.g., from one or more base stations 105) during a paging occasion. In this example, paging time window 203a includes two paging occasions 205a and 205b. Between paging occasions 205a and 205b, UE 115 may enter a sleep state (e.g., a relatively short sleep state). The length of time between the start of paging occasion 205a and the start of paging occasion 205b may correspond to the length of time of a DRX cycle (T_DRX), which may be determined by the network and may be selected from different durations (e.g., 320 milliseconds (ms), 640 ms, 1.28 seconds (s), 2.56 s). After paging time window 203a, UE 115 may enter a low power sleep state (e.g., a relatively long sleep state) 210 until the end (or near the end) of eDRX cycle 202. The length of time (T_eDRX) of eDRX cycle 202 may be determined by the network and may be selected from different durations. In one example, T_eDRX may be selected from a "power of two" value (e.g., 5.12 s, 10.24 s, . . . , 2621.44 s). In another example, T_eDRX may be selected from a "non-power of two" value (e.g., 10.24*(6, 10, 12, 14)=61.44 s, 102.4 s, 122.88 s, 143.36 s). Before entering sleep state 210, UE 115 may program a timer that will trigger UE 115 to wake up before the next paging occasion. The timer is driven by a sleep clock. In some cases, the sleep clock may be generated from a high-speed system clock (such as a 19.2 MHz crystal oscillator) or from a slower 32 kHz clock. As described in further detail below, other configurations of clocks and other modes of operating the clocks may be utilized. After eDRX cycle 202, UE 115 may repeat the eDRX cycle 202 with another paging time window 203b.

Figure 3:
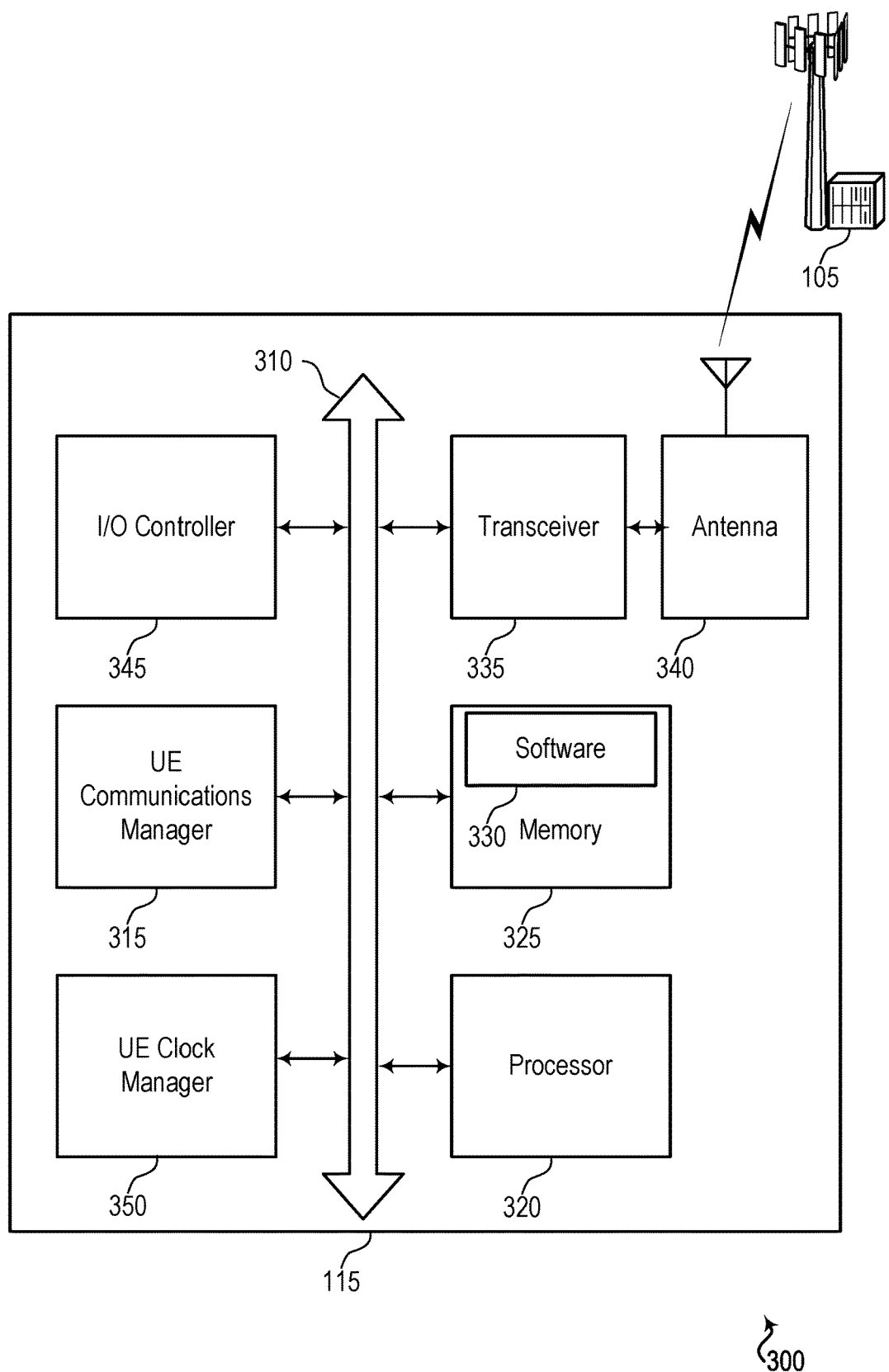
FIG. 3 illustrates a block diagram of a system including a UE that supports timing calibration control in eDRX in accordance with aspects of the present disclosure.

FIG. 3 shows a diagram of a system 300 including UE 115 that supports timing calibration control in eDRX in accordance with aspects of the present disclosure. Note that system 300 and its various components are shown for illustrative purposes only, and it is not meant to limit the scope of the present disclosure to any specific implementations of system 300. Skilled persons may derive alternative implementations of circuitry, logic, modules, managers, etc., for performing the functions described, and such alternatives are contemplated to be within the scope of the present disclosure. UE 115 may include components for bi-directional voice and data communications including components for transmitting and receiving communications, including UE communications manager 315, processor 320, memory 325, software 330, transceiver 335, antenna 340, I/O controller 345, and UE clock manager 350. These components may be in electronic communication via one or more buses (e.g., bus 310). UE 115 may communicate wirelessly with one or more base stations 105.

Processor 320 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 320 may be configured to operate a memory array using a memory controller. In other cases, a memory controller may be integrated into processor 320. Processor 320 may be configured to execute computer-readable instructions stored in a memory to perform various functions (e.g., functions or tasks supporting timing calibration control in eDRX).

Memory 325 may include random access memory (RAM) and read only memory (ROM). The memory 325 may store computer-readable, computer-executable software 330 including instructions that, when executed, cause the processor to perform various functions described herein. In some cases, the memory 325 may contain, among other things, a basic input/output system (BIOS) which may control basic hardware or software operation such as the interaction with peripheral components or devices.

Software 330 may include code to implement aspects of the present disclosure, including code to support timing calibration control in eDRX. Software 330 may be stored in a non-transitory computer-readable medium such as system memory or other memory. In some cases, the software 330 may not be directly executable by the processor but may cause a computer (e.g., when compiled and executed) to perform functions described herein.

Transceiver 335 may communicate bi-directionally, via one or more antennas, wired, or wireless links as described above. For example, the transceiver 335 may represent a wireless transceiver and may communicate bi-directionally with another wireless transceiver. The transceiver 335 may also include a modem to modulate the packets and provide the modulated packets to the antennas for transmission, and to demodulate packets from signals received from the antennas.

In some cases, the wireless device may include a single antenna 340. However, in some cases the device may have more than one antenna 340, which may be capable of concurrently transmitting or receiving multiple wireless transmissions.

I/O controller 345 may manage input and output signals for UE 115. I/O controller 345 may also manage peripherals not integrated into UE 115. In some cases, I/O controller 345 may represent a physical connection or port to an external peripheral. In some cases, I/O controller 345 may utilize an operating system such as iOS®, ANDROID®, MS-DOS®, MS-WINDOWS®, OS/2®, UNIX®, LINUX®, or another known operating system. In other cases, I/O controller 345 may represent or interact with a modem, a keyboard, a mouse, a touchscreen, or a similar device. In some cases, I/O controller 345 may be implemented as part of a processor. In some cases, a user may interact with UE 115 via I/O controller 345 or via hardware components controlled by I/O controller 345.

UE communications manager 315 and/or at least some of its various sub-components may be implemented in hardware, software executed by a processor, firmware, or any combination thereof. If implemented in software executed by a processor, the functions of the UE communications manager 315 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The UE communications manager 315 and/or at least some of its various sub-components may be physically located at various positions, including being distributed such that portions of functions are implemented at different physical locations by one or more physical devices. In some examples, UE communications manager 315 and/or at least some of its various sub-components may be a separate and distinct component in accordance with various aspects of the present disclosure. In other examples, UE communications manager 315 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure. UE communications manager 315 may perform various functions and/or steps to enable communication between UE 115 and one or more base stations 105.

UE clock manager 350 and/or at least some of its various sub-components may be implemented in hardware, software executed by a processor, firmware, or any combination thereof. If implemented in software executed by a processor, the functions of UE clock manager 350 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. UE clock manager 350 and/or at least some of its various sub-components may be physically located at various positions, including being distributed such that portions of functions are implemented at different physical locations by one or more physical devices. In some examples, UE clock manager 350 and/or at least some of its various sub-components may be a separate and distinct component in accordance with various aspects of the present disclosure. In other examples, UE clock manager 350 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure. UE clock manager 350 may include components and perform various functions and/or steps to support timing calibration control in eDRX as described in more detail below.

Figure 4:
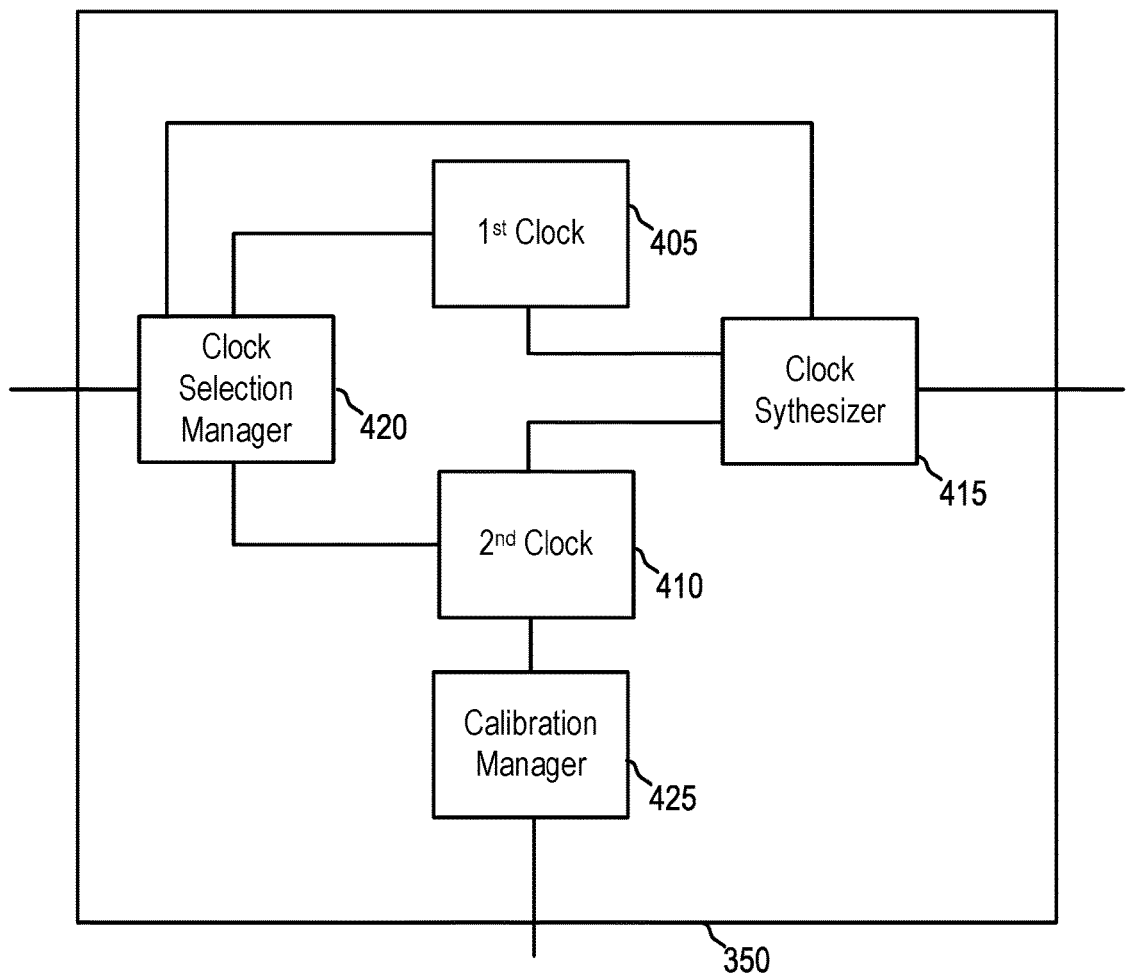
FIG. 4 shows a block diagram of a UE clock manager of a UE that supports timing calibration control in eDRX in accordance with aspects of the present disclosure.

FIG. 4 shows a block diagram of one example of UE clock manager 350 and its various components. Note that UE clock manager 350 and its various components are shown for illustrative purposes only, and it is not meant to limit the scope of the present disclosure to any specific implementations of UE clock manager 350. Skilled persons may derive alternative implementations of circuitry, logic, modules, managers, etc., for performing the functions described, and such alternatives are contemplated to be within the scope of the present disclosure. UE clock manager 350 includes a first clock 405 and a second clock 410. First clock 405 may have a relatively low power consumption and a relatively high frequency error in comparison with the second clock 410. In one example, first clock 405 may be a 32 kHz RC oscillator with a power consumption (as measured by current) of about 1 to 2 micro-Amps (µA) and a frequency error greater than about 300 parts-per-million (ppm). Second clock 410 may have a relatively high power consumption and a relatively low frequency error. In one example, second clock 410 may be a 19.2 MHz crystal oscillator (also referred to as an XO clock) with a power consumption of about 70 µA and a frequency error of about 2 ppm. First clock 405 and second clock 410 may be discrete from one another or may be integrated together (e.g., integrated in a power management integrated circuit (PMIC) or a system-on-chip (SOC) device).

First clock 405 and second clock 410 may be used to generate a sleep clock using a clock synthesizer 415. Clock synthesizer 415 may receive as inputs clock signals generated by first clock 405 and second clock 410, process those clock signals, and produce a clock signal of a desired frequency, which may serve as a timer for the sleep state of an eDRX cycle and be communicated to other components/systems of UE 115. In one aspect, clock synthesizer 415 may use the signal from first clock 405 to generate the clock signal. Clock synthesizer 415 may generate the clock signal by decimating the signal from first clock 405. Clock synthesizer 415 may use the signal from second clock 410 to calibrate (e.g., correct for frequency error/drift) the signal from first clock 405 by comparing the frequencies (e.g., computing a frequency ratio) of the signals from first and second clocks 405 and 410. Clock synthesizer 415 may use a calibration outcome when producing the clock signal based on the signal from first clock 405. In another aspect, clock synthesizer 415 may use the signal from second clock 410 to generate the clock signal. Clock synthesizer 415 may generate the clock signal by decimating the signal from second clock 410.

UE clock manager 350 may include a clock selection manager 420 that may be configured to select first clock 405 or second clock 410 as the source to produce the clock signal for the timer during an eDRX cycle and during other modes or configurations of operation. In one example, first clock 405 may be used as the source for the timer during selected portions of an eDRX cycle (e.g., during a sleep state) and second clock 410 may be used as the source for the timer during other selected portions of an eDRX cycle (e.g., during a paging time window). Clock selection manager 420 may be configured to signal to clock synthesizer 415 whether first clock 405 or second clock 410 is to be used as the source for the timer. Clock selection manager 420 may be configured to receive a signal from other components/systems of UE 115 that informs clock selection manager 420 which clock to select. Clock selection manager 420 may be configured to select between operating in a clock calibration mode (e.g., using first clock 405 as a timer and second clock 410 as a calibrator during intervals) or a non-calibration mode (e.g., using second clock 410 as the timer and turning first clock 405 off). Clock selection manager 420 may be configured to produce signals that selectively enable first clock 405 and/or second clock 410. Clock selection manager 420 may determine which clock to select, or which mode (calibration or non-calibration) to enable, based on various factors such as the eDRX cycle length, an error rate (ppm) threshold (e.g., a maximum allowed ppm error that may be tolerated with a modified search algorithm, or the ppm error that can satisfy a modified search algorithm timing drift requirement), the calibration frequency or period, energy or power consumption of using the calibration mode, or a combination thereof.

UE clock manager 350 may include a calibration manager 425 that controls various aspects of second clock 410 related to calibration of first clock 405. In one aspect, calibration manager 425 may determine and/or control a calibration frequency or period corresponding to second clock 410. Calibration manager 425 may selectively turn second clock 410 on during calibration intervals and off between calibration intervals. Calibration manager 425 may receive inputs such as the length or duration of an eDRX cycle (e.g., the length or duration of the sleep state of the eDRX cycle), measured or expected energy consumption of using the calibration mode, and/or measured or expected energy consumption of using a modified search algorithm. Calibration manager 425 may also measure or determine the expected energy consumption of using the calibration mode and measure or determine the expected energy consumption of using the modified search algorithm. Calibration manager 425 may determine the effects that different calibration frequencies or periods have on the measured or expected energy consumptions of using the calibration mode and the modified search algorithm to select a calibration frequency for a scenario. In one example, calibration manager 425 may tune the calibration frequency or rate to achieve a selected tradeoff between power (or energy) consumption and clock accuracy. For example, the more frequent second clock 410 is used to calibrate first clock 405 the more accurate the clock signal for the timer will be (e.g., the calibration frequency and clock accuracy are directly related) but more energy will be consumed. In one example, calibration manager 425 may select a calibration frequency based on a cycle duration of an eDRX cycle.

Figure 5:
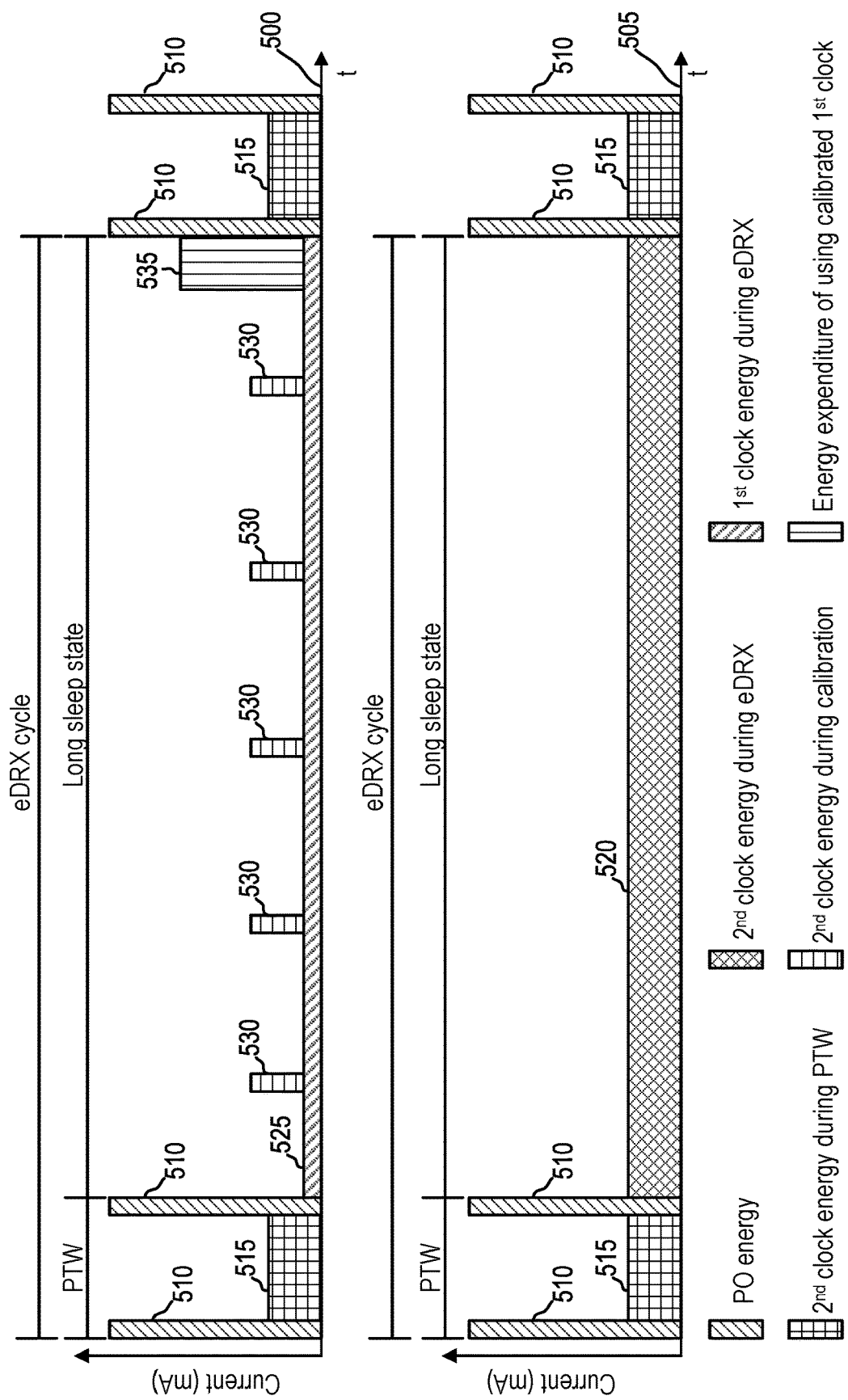
FIG. 5 shows timeline diagrams that illustrate aspects of timing calibration control in eDRX in accordance with aspects of the present disclosure.

FIG. 5 includes a first timeline 500 directed to an example of current consumption over time of the calibration mode during an eDRX cycle and a second timeline 505 directed to an example of current consumption over time of operating in a non-calibration mode during an eDRX cycle. The example corresponding to first timeline 500 may also be referred to as an energy profile of using the calibration mode, and the example corresponding to second timeline 505 may referred to as an energy profile of using second clock 410 in the non-calibration mode. The timelines of FIG. 5 are shown for illustrative purposes only and are not meant to limit the scope of the present disclosure to any specific methods or timing implementations. Skilled persons may derive alternatives that capture the functions described, and such alternatives are contemplated to be within the scope of the present disclosure.

As shown in timelines 500 and 505, the eDRX cycles have a paging time window (PTW), which includes paging occasions where current consumption (and hence, energy consumption shown by energy profiles 510) is relatively high due to various components of UE 115 being powered up to monitor for signals from one or more base stations 105. The PTW (or at least the paging occasions) may also be referred to as an awake state of the eDRX cycle. Between paging occasions of the PTW (e.g., during a relatively short sleep state) second clock 410 may be selected by clock selection manager 420 as the timer (and first clock 405 may be turned off). Between paging occasions second clock may consume energy as shown by energy profile 515.

As shown in non-calibration mode timeline 505, after the PTW second clock 410 may continue to be used as the timer during a long sleep state and may consume energy demonstrated by energy profile 520. At any given point during the long sleep state, second clock 410 may consume the same amount of current as a point during the PTW. First clock 405 may not be enabled for use during the non-calibration mode, which is demonstrated by an absence of an energy profile of first clock in timeline 505.

As shown in calibration mode timeline 500, after the PTW first clock 405 may be selected as the timer by clock selection manager 420 and may consume energy as demonstrated by energy profile 525. In general, first clock 405 may use less current and may consume less energy than second clock 410, which is represented by energy profile having a smaller amplitude than energy profiles 515 and 520. Second clock 410 may be turned off after the PTW, except during calibration intervals as demonstrated by energy consumption profiles 530. Calibration manager 425 may turn on second clock 410 during calibration intervals to correct for timing error of first clock 405. In one example, calibration intervals may occur periodically.

Prior to the end of the eDRX cycle, UE 115 may prepare for the next PTW by enabling various ones of its components (e.g., RF components, baseband components, memory). This preparation phase may be referred to as a modified search algorithm, and during this phase UE 115 may consume energy represented by energy profile 535. The current consumption corresponding to energy profile 535 may be relatively large compared to the current consumption during the other portions of the long sleep state of the eDRX cycle. The amount of energy corresponding to energy profile 535 may be referred to as an energy expenditure of UE 115 to prepare for an awake state or PTW of the eDRX cycle. The amount of energy corresponding to energy profile 535 may be dependent on the calibration frequency or period. In one example, the amount of energy corresponding to energy profile 535 may be inversely related to the calibration frequency such that an increase in the calibration frequency may result in a decrease in the energy of energy profile 535, or a decrease in the calibration frequency may result in an increase in the energy of energy profile 535.

Figure 6:
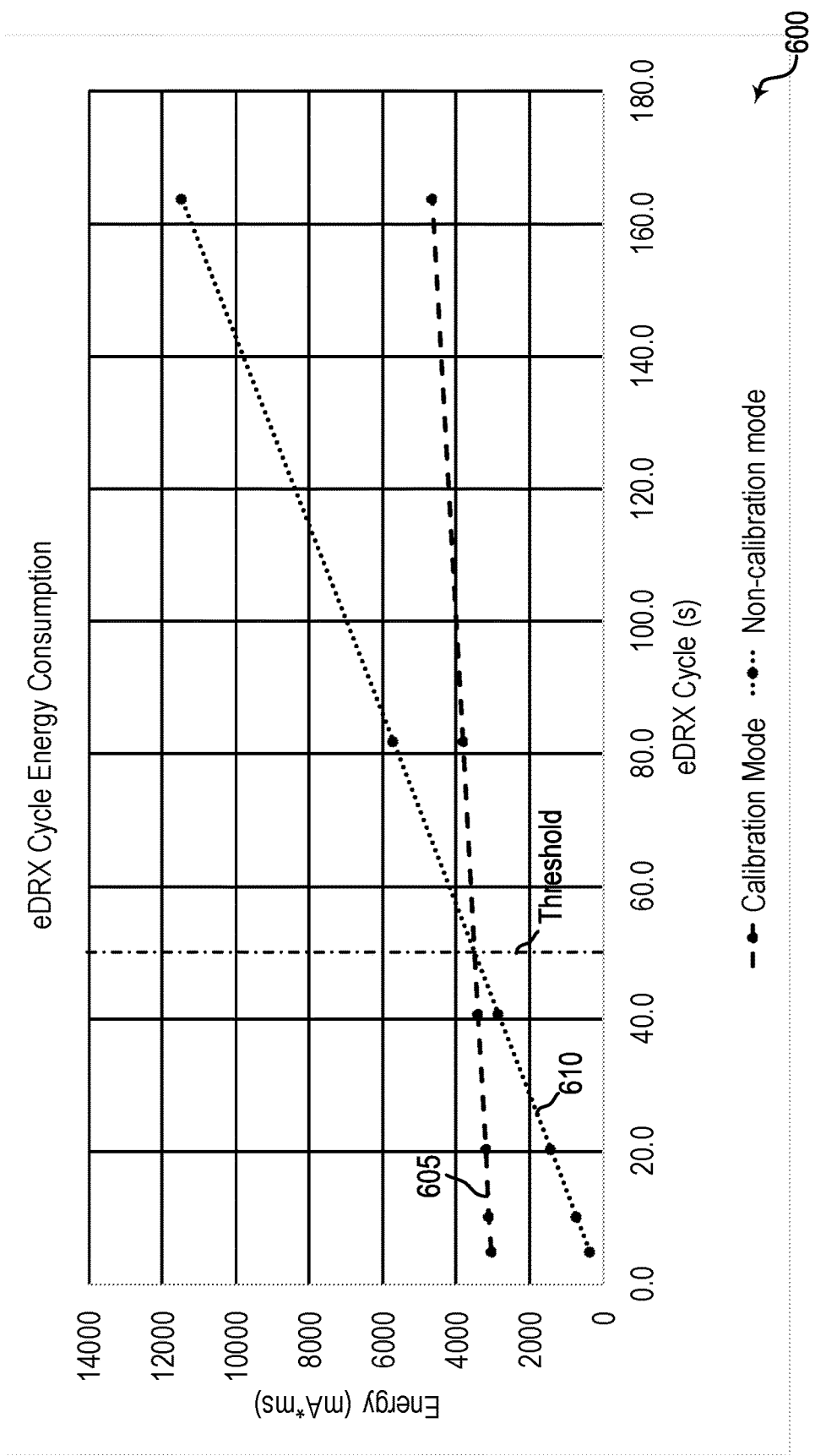
FIGS. 6 and 7 show example performance graphs of a device that supports timing calibration control in eDRX in accordance with aspects of the present disclosure.

FIG. 6 is a graph 600 that provides example energy consumption versus eDRX cycle length plots for different modes of operation. The plots of FIG. 6 are shown for illustrative purposes only and are not meant to limit the scope of the present disclosure to any specific methods or implementations. Skilled persons may derive alternatives that capture the functions described, and such alternatives are contemplated to be within the scope of the present disclosure. FIG. 6 shows a first plot 605 corresponding to the energy consumption of using a clock calibration mode (e.g., using first clock 405 as a timer and second clock 410 as a calibrator) for various durations or lengths of an eDRX cycle. Referring to FIG. 5, the energy consumption of first plot 605 corresponds to a combination of the energies of profiles 525, 530 and 535 versus different eDRX cycle lengths. FIG. 6 also shows a second plot 610 corresponding to the energy consumption of using a non-calibration mode (e.g., using second clock 410 as the timer and turning first clock 405 off) for various durations or lengths of an eDRX cycle. Referring to FIG. 5, the energy consumption of second plot 610 corresponds to the energy of profile 520 versus different eDRX cycle lengths.

The example plots of FIG. 6 show a higher energy consumption for the calibration mode compared to the non-calibration mode for relatively short eDRX cycle lengths. In this example, the plots show that for eDRX cycle durations or lengths less than about 50 seconds the calibration mode consumes more energy than the non-calibration mode. However, for eDRX cycle lengths of about 50 seconds or more the calibration mode consumes less energy than the non-calibration mode, and the difference in energy consumption between the non-calibration mode and calibration mode become larger with time over 50 seconds. The time at which plots 605 and 610 intersect may be considered a threshold value of time of the eDRX cycle length that may be used by UE 115 (e.g., by clock selection manager 420) to determine whether to use the calibration mode or the non-calibration mode. In other words, UE 115 may determine whether to use the calibration mode based on the eDRX cycle duration or length (e.g., comparing the eDRX cycle duration or length to a threshold value). For example, if the eDRX cycle length is equal to or greater than the threshold value clock selection manager 420 may select to operate in the calibration mode, and if the eDRX cycle length is less than the threshold value clock selection manager 420 may select to operate in the non-calibration mode. In the example of FIG. 6, a threshold value of about 50 seconds is depicted.

However, the threshold value is not limited to this example. Other thresholds are contemplated to be within the scope of the present disclosure. The slopes of the plots and the intersection of the curves, and thus the threshold value, may be vary based on different factors such as component selection, calibration frequency, and other factors that affect the energy consumption of UE 115.

From another perspective, the selection of using the calibration mode or the non-calibration mode may be based on a comparison of energy profiles for a given eDRX cycle length. For example, the energy consumed using the calibration mode may include the energy consumption of first clock 405 (e.g., energy corresponding to profile 525), the energy consumption of second clock 410 during calibration intervals (e.g., energy corresponding to profile 530) and the energy consumption of using the modified search algorithm (e.g., energy corresponding to profile 535) for a given eDRX cycle length. The energy consumed during the non-calibration mode may include the energy consumption of second clock 410 (e.g., energy corresponding to profile 520) for a given eDRX cycle length. The mode selection may be carried out by comparing the energy consumed using the calibration mode and the energy consumed using the non-calibration mode. For example, the calibration mode may be selected if:

(energy profile 525+energy profile 530+energy profile 535)<energy profile 520.

Figure 7:
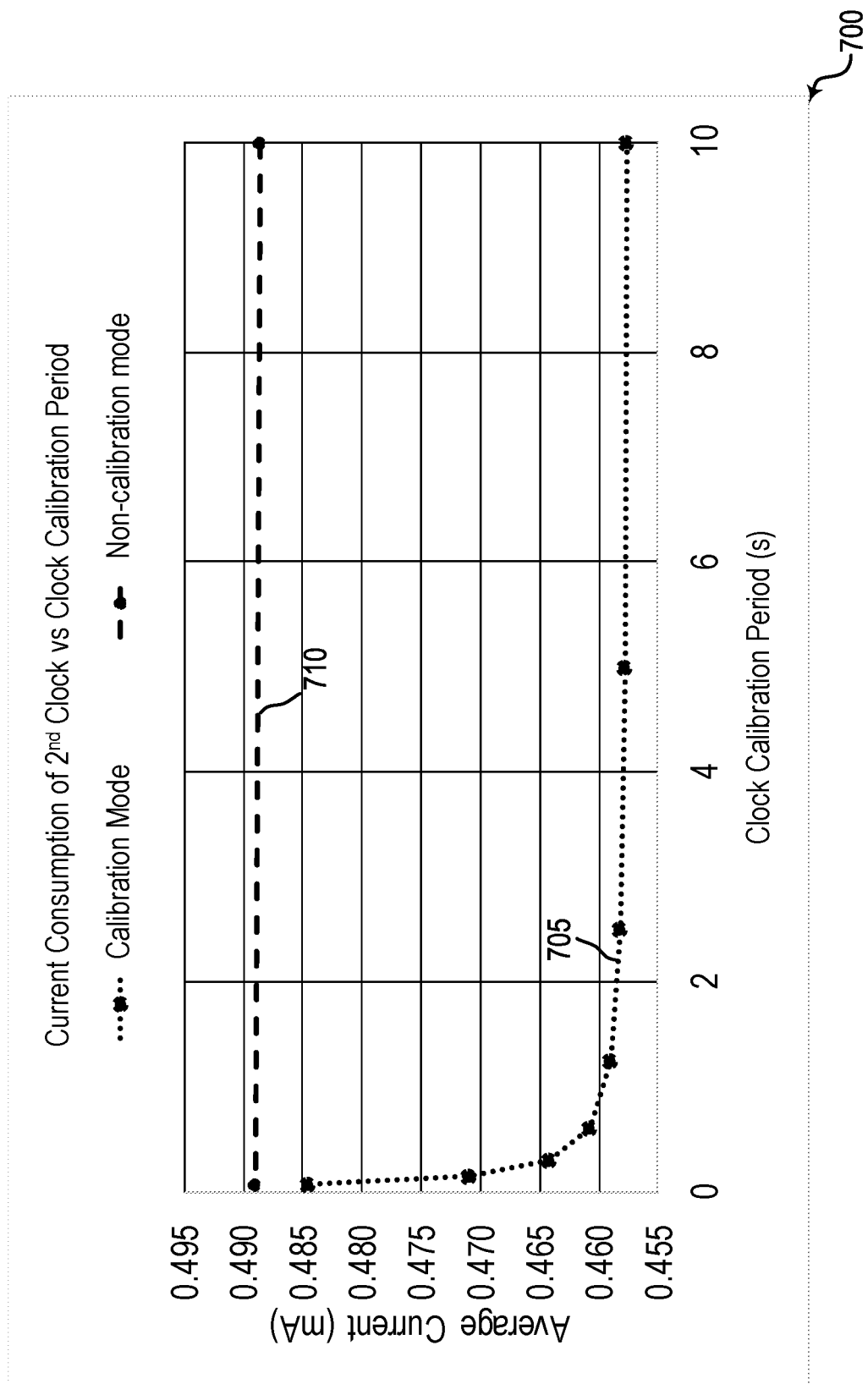

FIG. 7 is a graph 700 that provides example average current consumption of second clock 410 versus calibration period plots for different modes of operation. The plots of FIG. 7 are shown for illustrative purposes only and are not meant to limit the scope of the present disclosure to any specific methods or implementations. Skilled persons may derive alternatives that capture the functions described, and such alternatives are contemplated to be within the scope of the present disclosure. The calibration period in FIG. 7 corresponds to the length of time between calibration intervals (e.g., a calibration period of 6 seconds means that a calibration interval occurs every 6 seconds). FIG. 7 shows a first plot 705 corresponding to the average current consumption of second clock 410 using the calibration mode (e.g., using first clock 405 as a timer and second clock 410 as a calibrator) for various calibration periods. For comparison purposes, FIG. 7 also shows a second plot 710 corresponding to the average current consumption of second clock 410 using the non-calibration mode (e.g., using second clock 410 as the timer and turning first clock 405 off). Second plot 710 is flat given that second clock 410 is turned on constantly and is not used as a calibrator in the non-calibration mode.

As shown in FIG. 7, as the calibration period increases (or as the calibration frequency decreases) in the calibration mode, the average current consumption (and the energy consumption) of second clock 410 decreases because second clock 410 is turned on less frequently. In other words, the energy consumption of second clock 410 is directly related to the calibration frequency and inversely related to the calibration period. However, as the calibration period increases, the energy consumption of using the modified search algorithm may increase and/or the ppm error of the calibration mode may increase. Thus, the changes to the energy consumption of using the modified search algorithm (e.g., the energy consumption of the UE to prepare for an awake state of the eDRX cycle), and the changes to the ppm error of the calibration mode, may be directly related to the change in calibration period and inversely related to the change in calibration frequency. Calibration manager 425 may determine a calibration period (or frequency) based on various factors such as the current (or energy) consumption of second clock 410, the energy consumption of using the modified search algorithm, and/or the ppm error for various calibration frequencies. In one aspect, calibration manager 425 may use a look-up table (LUT) corresponding to one or more of these factors (e.g., a LUT that provides clock ppm error versus calibration frequency) for various calibration period or frequencies to select the calibration period or frequency. In one aspect, calibration manager 425 may use an optimization model corresponding to one or more of the various factors to select the calibration period or frequency. In one example, calibration manager 425 may select a calibration frequency by comparing the energy consumption of using the modified search algorithm and the energy consumption of second clock 410 for various calibration frequencies.

Figure 8:
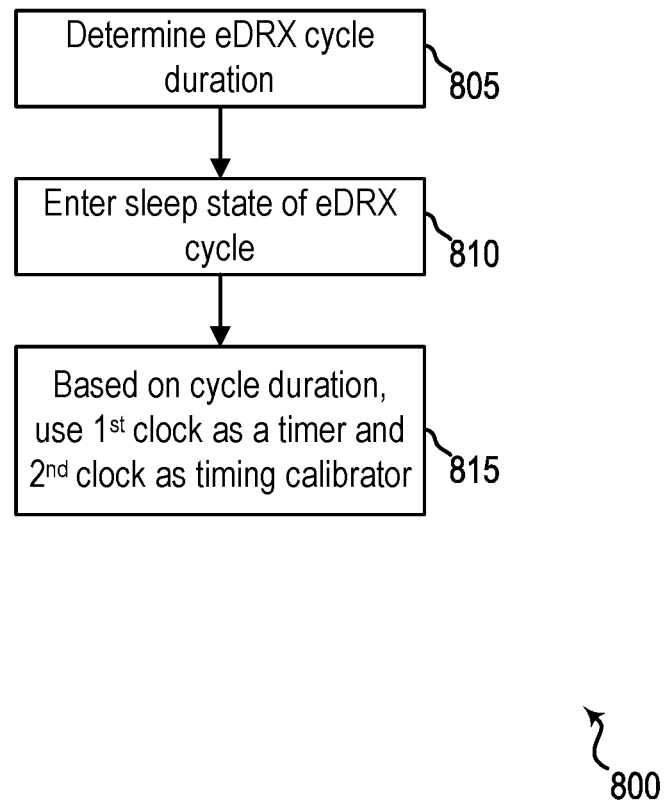
FIGS. 8 and 9 illustrates methods for timing calibration control in eDRX in accordance with aspects of the present disclosure.

FIG. 8 shows a flowchart illustrating a method 800 for timing calibration control in eDRX in accordance with aspects of the present disclosure. The operations of method 800 may be implemented by a UE 115 or its components as described herein. For example, the operations of method 800 may be performed by UE clock manager 350 as described with reference to FIGS. 3 through 7. In some examples, a UE 115 may execute a set of codes to control the functional elements of the device to perform the functions described below. Additionally or alternatively, the UE 115 may perform aspects of the functions described below using special-purpose hardware.

At block 805 UE 115 may determine an eDRX cycle duration or length. The operations of block 805 may be performed according to the methods described herein. In certain examples, aspects of the operations of block 805 may be performed by a UE clock manager 350 as described with reference to FIGS. 3 through 7.

At block 810 UE 115 may enter a sleep state (e.g., a long sleep state) of an eDRX cycle. The operations of block 810 may be performed according to the methods described herein. In certain examples, aspects of the operations of block 810 may be performed by a UE communication manager 315 and/or a UE clock manager 350 as described with reference to FIGS. 3 through 7.

At block 815 the UE 115 may use first clock 405 as a timer for the sleep state of the eDRX cycle and use second clock 410 as a timing calibrator of first clock 405 during the sleep state. The decision to use first clock 405 as the timer and second clock 410 as the calibrator may be based on the eDRX cycle duration or length. The operations of block 815 may be performed according to the methods described herein. In certain examples, aspects of the operations of block 815 may be performed by UE clock manager 350 as described with reference to FIGS. 3 through 7. The decision to use first clock 405 as the timer for the sleep state of the eDRX cycle and use second clock 410 as the timing calibrator may also be based on other factors. In one example, this decision may be based on the energy expenditure of using the modified search algorithm (e.g., the energy expenditure of the UE to prepare for an awake state of an eDRX cycle) for a selected calibration frequency and the energy expenditure of second clock 410 during calibration intervals for the selected calibration frequency. In another example, this decision may be based on the energy expenditure of using the modified search algorithm (e.g., the energy expenditure of the UE to prepare for an awake state of an eDRX cycle) for a selected calibration frequency, the energy expenditure of second clock 410 during calibration intervals for a selected calibration frequency and the energy expenditure of first clock 405 during the sleep state of the eDRX cycle.

It should be noted that the methods described above with reference to FIG. 8 describe possible implementations, and that the operations and the steps may be rearranged or otherwise modified and that other implementations are possible. Further, aspects from two or more of the methods may be combined.

Figure 9:
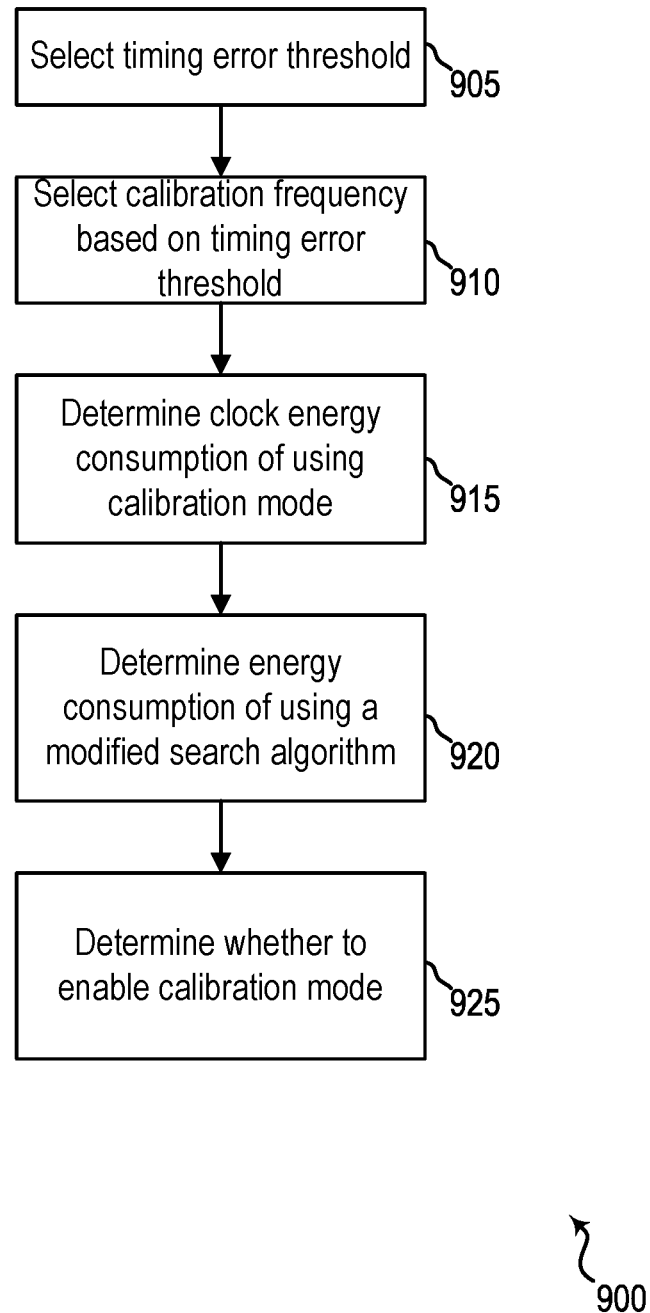

FIG. 9 shows a flowchart illustrating a method 900 for timing calibration control in eDRX (in particular, for determining whether to use the calibration mode described above) in accordance with aspects of the present disclosure. The operations of method 900 may be implemented by a UE 115 or its components as described herein. For example, the operations of method 900 may be performed by a UE clock manager 350 as described with reference to FIGS. 3 through 7. In some examples, UE 115 may execute a set of codes to control the functional elements of the device to perform the functions described below. Additionally or alternatively, UE 115 may perform aspects of the functions described below using special-purpose hardware.

At block 905 UE 115 may select a timing error threshold, which may correspond to a ppm error threshold. The timing error threshold may be selected based on timing drift requirements or a maximum allowed ppm error of the modified search algorithm. In an aspect, the timing drift requirements and/or the maximum allowed ppm error may depend on the eDRX cycle duration or length. The operations of block 905 may be performed according to the methods described herein. In certain examples, aspects of the operations of block 905 may be performed by UE clock manager 350 as described with reference to FIGS. 3 through 7.

At block 910 UE 115 may select a calibration frequency or period based the selected timing error threshold. The calibration frequency or period may be selected by referring to a LUT that provides clock error values (e.g., ppm values) versus calibration frequency or period. The calibration frequency or period may be selected based on the corresponding clock error value that satisfies the timing error threshold. The selection of the calibration frequency may take into account timing drifts due to temperature and aging of various components. The operations of block 910 may be performed according to the methods described herein. In certain examples, aspects of the operations of block 910 may be performed by UE clock manager 350 as described with reference to FIGS. 3 through 7.

At block 915 UE 115 may determine a clock energy consumption of using the calibration mode. The clock energy consumption may include the energy consumption of using first clock 405 during the sleep state and the energy consumption of second clock 410 during the calibration intervals of the sleep state. The energy consumption of second clock 410 may be directly dependent on the calibration frequency selected. The clock energy consumption may be based on the duration or length of the eDRX cycle. The clock energy consumption may be measured, known, or estimated. The operations of block 915 may be performed according to the methods described herein. In certain examples, aspects of the operations of block 915 may be performed by UE clock manager 350 as described with reference to FIGS. 3 through 7.

At block 920 UE 115 may determine an energy consumption of using the modified search algorithm as described above. The energy consumption of using the modified search algorithm may be dependent on the calibration frequency selected and may have an inverse relationship to changes in the calibration frequency. The energy consumption of using the modified search algorithm may be measured, known, or estimated. The operations of block 920 may be performed according to the methods described herein. In certain examples, aspects of the operations of block 920 may be performed by UE clock manager 350 as described with reference to FIGS. 3 through 7.

At block 925 UE 115 may determine whether to enable the calibration mode. In one aspect, the determination may be based on one or more of the parameters described with reference to blocks 905-920 (e.g., the timing error threshold, the calibration frequency, clock energy consumption, energy consumption of using the modified search algorithm). In one aspect, the determination may be based on comparing a sum of (1) the determined clock energy consumption and (2) the energy consumption of using the modified search algorithm versus an energy consumption of operating in the non-calibration mode. The determination to enable the calibration mode may be made at run-time. The energy consumption of using the modified search algorithm may be dependent on the calibration frequency selected and may have an inverse relationship to changes in the calibration frequency. The energy consumption of using the modified search algorithm may be measured, known, or estimated. The operations of block 925 may be performed according to the methods described herein. In certain examples, aspects of the operations of block 925 may be performed by UE clock manager 350 as described with reference to FIGS. 3 through 7.

It should be noted that the methods described above with reference to FIG. 9 describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

A macro cell generally covers a relatively large geographic area (e.g., several kilometers in radius) and may allow unrestricted access by UEs 115 with service subscriptions with the network provider. A small cell may be associated with a lower-powered base station 105, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications system 100 or systems described herein may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise random-access memory (RAM), read-only memory (ROM), electrically erasable programmable read only memory (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A user equipment (UE) for wireless communication, comprising:
   a clock manager including a first clock and a second clock, said second clock having a higher power consumption and a lower frequency error than the first clock;
   a processor coupled to the clock manager;
   memory coupled to the processor; and
   instructions stored in the memory and operable, when executed by the processor, to cause the UE to:
      determine a cycle duration of an extended discontinuous reception (eDRX) cycle of the UE; and
      determine whether to use the first clock as a timer during a sleep state of the eDRX cycle based on the cycle duration of the eDRX cycle.

2. The UE of claim 1, wherein the instructions are operable to cause the UE to:
   use the first clock as the timer and the second clock as the timing calibrator in response to the cycle duration of the eDRX cycle being equal to or greater than a threshold; and
   use the second clock as the timer in response to the cycle duration of the eDRX cycle being less than the threshold.

3. The UE of claim 1, wherein the instructions are operable to cause the UE to use the second clock at periodic intervals during the sleep state.

4. The UE of claim 3, wherein the instructions are operable to cause the UE to select a frequency of the periodic intervals based on the cycle duration of the eDRX cycle.

5. The UE of claim 3, wherein the instructions are operable to cause the UE to select a frequency of the periodic intervals based on a comparison of:
   a first energy expenditure of the UE to prepare for an awake state of the eDRX cycle; and
   a second energy expenditure of the second clock during calibration intervals.

6. The UE of claim 5, wherein the first energy expenditure of the UE and the second energy expenditure of the second clock are dependent on the frequency of the periodic intervals.

7. The UE of claim 6, wherein the first energy expenditure of the UE is inversely related to the frequency of the periodic intervals and the second energy expenditure of the second clock is directly related to the frequency of the periodic intervals.

8. The UE of claim 7, wherein the instructions are operable to cause the UE to use the first clock as the timer and the second clock as the timing calibrator for the first clock based on the first and the second energy expenditures for a selected frequency of the periodic intervals.

9. The UE of claim 8, wherein the instructions are operable to cause the UE to use the first clock as the timer and the second clock as the timing calibrator for the first clock based on a third energy expenditure of the first clock during the sleep state of the eDRX cycle.

10. The UE of claim 1, wherein the UE is an Internet-of-things (IoT) device.

11. A method for wireless communication by a user equipment (UE), comprising:
    determining a cycle duration of an extended discontinuous reception (eDRX) cycle;
    entering a sleep state of the eDRX cycle; and
    determining whether to use a first clock as a timer and a second clock as a timing calibrator during the sleep state based on the cycle duration of the eDRX cycle, the second clock having a higher power consumption and a lower frequency error than the first clock.

12. The method of claim 11, further comprising:
    turning off the first clock during an awake state of the eDRX cycle; and
    using the second clock as the timer during the awake state of the eDRX cycle.

13. The method of claim 11, further comprising:
    using the first clock as the timer and the second clock as the timing calibrator in response to the cycle duration of the eDRX cycle being equal to or greater than a threshold; and
    using the second clock as the timer in response to the cycle duration of the eDRX cycle being less than the threshold.

14. The method of claim 11, further comprising using the second clock as the timing calibrator at periodic intervals during the sleep state.

15. The method of claim 14, wherein a frequency of the periodic intervals is based on the cycle duration of the eDRX cycle.

16. The method of claim 14, wherein a frequency of the periodic intervals is based on a comparison of:
    a first energy expenditure of the UE to prepare for an awake state of the eDRX cycle; and
    a second energy expenditure of the second clock during calibration intervals.

17. The method of claim 16, wherein the first energy expenditure of the UE and the second energy expenditure of the second clock are dependent on the frequency of the periodic intervals.

18. The method of claim 17, wherein the first energy expenditure of the UE is inversely related to the frequency of the periodic intervals and the second energy expenditure of the second clock is directly related to the frequency of the periodic intervals.

19. The method of claim 18, further comprising using the first clock as the timer and the second clock as the timing calibrator for the first clock based on the first and the second energy expenditures for a selected frequency of the periodic intervals.

20. The method of claim 19, further comprising using the first clock as the timer and the second clock as the timing calibrator for the first clock based on a third energy expenditure of the first clock during the sleep state of the eDRX cycle.

21. A user equipment (UE) for wireless communication, comprising:
    means for determining a cycle duration of an extended discontinuous reception (eDRX) cycle;
    means for entering a sleep state of the eDRX cycle; and means for determining whether to use a first clock as a timer and a second clock as a timing calibrator during the sleep state based on the cycle duration of the eDRX cycle, the second clock having a higher power consumption and a lower frequency error than the first clock.

22. The UE of claim 21, further comprising:
means for using the first clock as the timer and the second clock as the timing calibrator in response to the cycle duration of the eDRX cycle being equal to or greater than a threshold; and
means for using the second clock as the timer in response to the cycle duration of the eDRX cycle being less than the threshold.

23. The UE of claim 21, further comprising means for using the second clock as the timing calibrator at periodic intervals during the sleep state.

24. The UE of claim 23, wherein a frequency of the periodic intervals is based on the cycle duration of the eDRX cycle.

25. The UE of claim 23, wherein a frequency of the periodic intervals is based on a comparison of:
a first energy expenditure of the UE to prepare for an awake state of the eDRX cycle; and
a second energy expenditure of the second clock during calibration intervals.

26. The UE of claim 25, wherein the first energy expenditure of the UE and the second energy expenditure of the second clock are dependent on the frequency of the periodic intervals.

27. The UE of claim 26, wherein the first energy expenditure of the UE is inversely related to the frequency of the periodic intervals and the second energy expenditure of the second clock is directly related to the frequency of the periodic intervals.

28. The UE of claim 27, further comprising means for using the first clock as the timer and the second clock as the timing calibrator for the first clock based on the first and the second energy expenditures for a selected frequency of the periodic intervals.

29. The UE of claim 28, further comprising means for using the first clock as the timer and the second clock as the timing calibrator for the first clock based on a third energy expenditure of the first clock during the sleep state of the eDRX cycle.

30. A non-transitory computer readable medium storing code for wireless communication, the code comprising instructions executable by a processor to:
determine a cycle duration of an extended discontinuous reception (eDRX) cycle;
enter a sleep state of the eDRX cycle; and
determine whether to use a first clock as a timer and a second clock as a timing calibrator during the sleep state based on the cycle duration of the eDRX cycle, the second clock having a higher power consumption and a lower frequency error than the first clock.

* * * * *